United States Patent [19]

Ieki

[11] 4,295,108
[45] Oct. 13, 1981

[54] FILTER CIRCUIT EMPLOYING SURFACE ACOUSTIC WAVE DEVICE

[75] Inventor: Hideharu Ieki, Nagaokakyo, Japan

[73] Assignee: Murata Manufacturing Co., Ltd., Japan

[21] Appl. No.: 188,226

[22] Filed: Sep. 17, 1980

[30] Foreign Application Priority Data

Sep. 25, 1979 [JP] Japan ................... 54/123343

[51] Int. Cl.³ .................. H03H 9/64; H03H 9/60
[52] U.S. Cl. .................... 333/193; 333/189
[58] Field of Search .............. 333/186–196,
333/150–155; 310/313 A, 313 B, 313 C, 313 D, 311, 320–321, 365–366; 358/36–38, 155, 904–905

[56] References Cited

U.S. PATENT DOCUMENTS 4,037,181  7/1977  Ieki et al.

Primary Examiner—Marvin L. Nussbaum
Attorney, Agent, or Firm—Ostrolenk, Faber, Gerb & Soffen

[57] ABSTRACT

A filter circuit comprises a surface acoustic wave device including input and output transducers. A tuning coil is interposed in series between an input terminal and the input transducer and/or between an output terminal and the output transducer. A piezoelectric resonator is connected in parallel with the tuning coil. The resonance frequency of the piezoelectric resonator is selected to be approximately equal to the frequency where an attenuation pole appears. The tuning coil and a capacitance component of the piezoelectric resonator and a clamp capacitance of the transducer constitute a tuning circuit, which is tuned to a given frequency in the passband.

8 Claims, 6 Drawing Figures

FILTER CIRCUIT EMPLOYING SURFACE ACOUSTIC WAVE DEVICE

BACKGROUND OF THE INVENTION

1. Field of the Invention

The present invention relates to a filter circuit. More specifically, the present invention relates to a filter circuit employing a surface acoustic wave device for use in a video intermediate frequency circuit of a television receiver, for example.

2. Description of the Prior Art

A video intermediate frequency filter using a surface acoustic wave device in a television receiver, for example, has been proposed and put into practical use. Application of a surface acoustic wave device as a video intermediate frequency filter, for example, is disclosed in U.S. Pat. No. 3,582,838, issued June 1, 1971 to Adrian J. DeVries and entitled "SURFACE WAVE DEVICES." On the other hand, it is required that a video intermediate frequency filter have an ample amount of attenuation at a predetermined frequency such as the sound carrier frequency of the adjacent channel to eliminate interference. In utilizing a surface acoustic wave filter as a video intermediate frequency filter, for example, as in the case of the patent referred to above, a surface acoustic wave filter is designed to meet the above described requirement in full consideration of the pattern and the like of the interdigital electrode of the filter. However, in actuality a sufficient degree of attenuation amount can not often be attained due to reflection loss, variation in the characteristic of the products and so on. Furthermore, since a surface acoustic wave filter pertains to a category of a filter of a so-called concentrated constant type, a surface acoustic wave filter is very often used in combination with an integrated circuit as a matter of practice; however, it is extremely difficult to implement an integrated circuit so as to exhibit a filter characteristic and accordingly it is necesary to attain a desired frequency characteristic with a surface acoustic wave filter in employing such filter in combination with an integrated circuit. In other words, in employing a surface acoustic wave filter in combination with an integrated circuit, a portion for inserting an interstage tuning element is often unavailable. Therefore, one might think of implementing a filter circuit having a large degree of attenuation pole of a sufficiently large attenuation by employing a given auxiliary element in association with a surface acoustic wave device.

FIG. 1 is a schematic diagram showing one example of a filter circuit which may be considered in the light of the foregoing background. The FIG. 1 filter circuit comprises a surface acoustic wave device 1. The surface acoustic wave device 1 comprises an input transducer 2 and an output transducer 3, each including an interdigital electrode. The input transducer 2 is connected to an input signal source 6. A resistor 7 denotes a resistive component of the signal source 6. The output transducer 3 is connected through a load resistor 8 to the subsequent circuit 9. A piezoelectric resonator 10 is connected in parallel with the input transducer 2. The piezoelectric resonator 10 may be connected in parallel with the output transducer 3, as shown by the dotted line in FIG. 1. The piezoelectric resonator 10 is used as a trap device. Accordingly, a component of the frequency equal to the resonance frequency of the piezoelectric resonator 10 out of the input signal obtained from the input signal source 6 is trapped through the resonator 10 and will not be passed to the load resistor 8 and the subsequent circuit 9. Thus, although the FIG. 1 circuit is entirely different in principle from the present invention, a sufficient amount of attentuation can be attained with respect to a given frequency.

However, the FIG. 1 circuit involves the following problem to be solved. More specifically, assuming that the impedance of the surface acoustic wave filter 1 and the impedance of the piezoelectric resonator 10 in the passband of the filter are Zs and Zx, respectively, where the impedance Zx is solely dependent on the capacitance component of the resonator 10, and these impedances Zs and Zx have the relation Zs Zx, then the insertion loss of the filter circuit increases and the signal level at the passband decreases. The reason is that since the impedance Zx of the resonator 10 is small, the resonator 10 comes to short-circuit the transducer of the surface acoustic wave filter 1, and accordingly, although a sufficient amount of attentuation is attained at a given frequency corresponding to the resonance frequency of the resonator 10, say at adjacent sound carrier frequency, the above described insertion loss becomes large. Conversely, assuming that the relation of these impedances Zs and Zx is Zs Zx, very little influence is exerted upon the passband; however, the extent of an improvement of the amount of attenuation at the given frequency would become smaller. Accordingly, the mere connection of a piezoelectric resonator as a trap device in parallel with a transducer, as shown in FIG. 1, does not bring about a satisfactory result.

SUMMARY OF THE INVENTION

Briefly described, the present invention comprises a filter circuit including a surface acoustic wave device, and a parallel circuit of a tuning coil and a piezoelectric resonator interposed between an input and an input transducer of the surface acoustic wave device and/or between an output and an output transducer of the surface acoustic wave device. The resonance frequency of the piezoelectric resonator is selected to be associated with the frequency at an attenuation pole. According to the present invention, since the piezoelectric resonator is not coupled to the transducer in a parallel fashion, the amount of attenuation at a predetermined frequency can be sufficiently increased with very little adverse influence upon the passband.

According to a preferred embodiment of the present invention, a device, such as a resistor, a capacitor or the like, for decreasing an impedance changing range is connected in series with the piezoelectric resonator and the above described series connection is connected in parallel with the tuning coil. According to the preferred embodiment under discussion, the effect of the peizoelectric resonator can be controlled by properly selecting the value of these components and accordingly an optimum frequency characteristic can be attained with ease.

Accordingly, a principal object of the present invention is to provide an improved filter circuit.

Another object of the present invention is to provide a filter circuit employing a surface acoustic wave device that can secure a sufficient degree of attenuation with very little adverse influence upon the passband.

A further object of the present invention is to provide a filter circuit employing a surface acoustic wave device that can attain a sufficient amount of attenuation with very little influence upon the passband by means of the skilful use of the characteristic of the piezoelectric resonator and with a simple circuit configuration.

Still a further object of the present invention is to provide a filter circuit employing a surface acoustic wave device that can control the effect of a piezoelectric resonator.

These objects and other objects, features, aspects and advantages of the present invention will become more apparent from the following detailed description of the present invention when taken in conjuction with the accompanying drawings.

DESCRIPTION OF THE PREFERRED EMBODIMENTS

Figure 1:
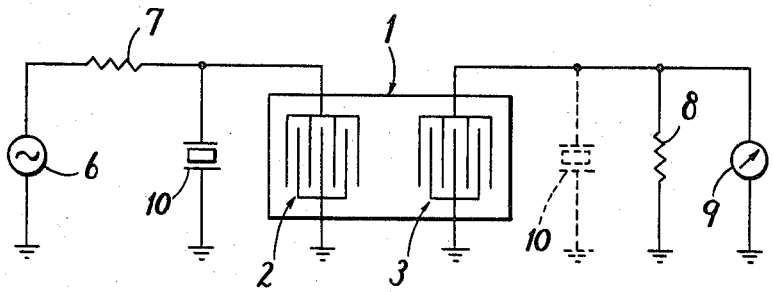
FIG. 1 is a schematic diagram showing one example of a filter circuit employing a conventional surface acoustic wave device which constitutes the background of the invention.
Figure 2:
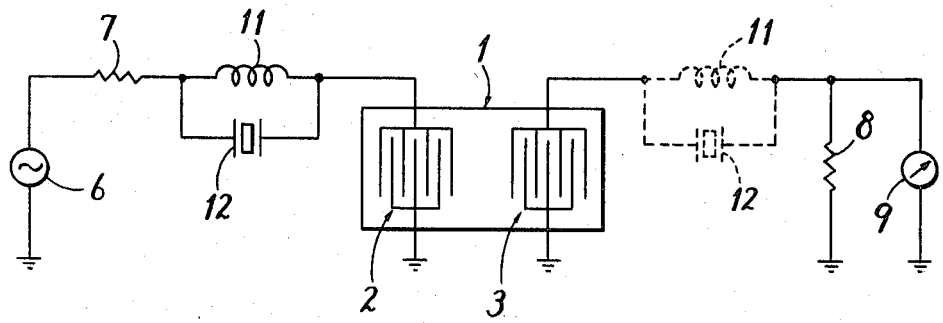
FIG. 2 is a schematic diagram showing one embodiment of the present invention.
Figure 3:
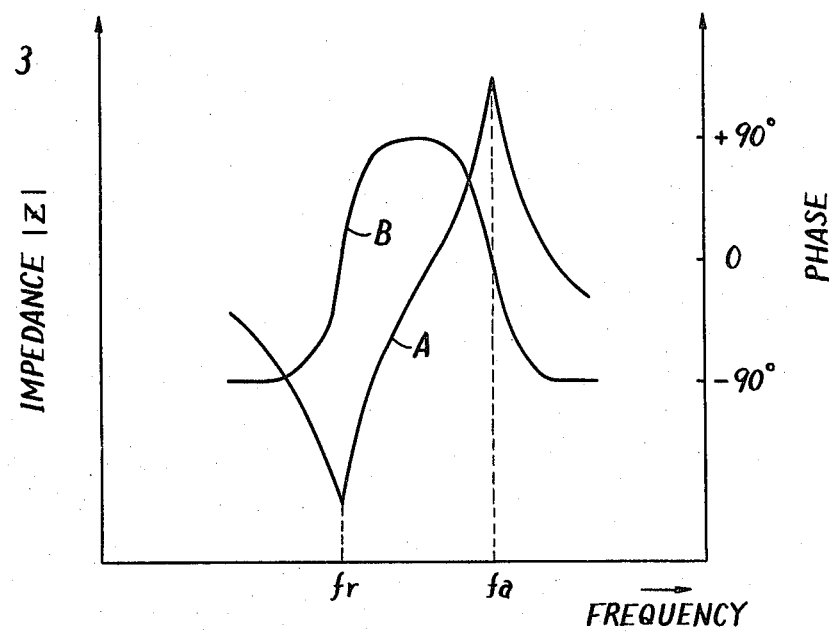
FIG. 3 is a graph showing the characteristic of a piezoelectric resonator which can be used in the present invention.

FIG. 2 is a schematic diagram showing one embodiment of the present invention. Referring to FIG. 2, a parallel circuit comprising a tuning coil 11 and a piezoelectric resonator 12 is interposed between an input transducer 2 of a surface acoustic wave device 1 and an input signal source 6. On the other hand, an output transducer 3 is connected through a load resistor 8 to a circuit 9 (the subsequent stage). As is well-known, the surface acoustic wave device 1 comprises two sets of interdigital electrodes formed on a piezoelectric substrate, one set forming the input transducer 2 and the other set forming the output transducer 3. The tuning coil 11 may be considered as equivalent to the tuning coil shown in the previously referred-to referenced U.S. Pat. No. 3,582,838. The piezoelectric resonator for use in the present invention is adapted to exhibit a resonance characteristic like that shown in FIG. 3, for example. The curve A in FIG. 3 shows the impedance Z associated with the resonance frequency fr and the antiresonance frequency fa and the curve B in FIG. 3 shows the phase characteristic thereof. As can be seen from FIG. 3, the piezoelectric resonator 12 exhibits a range of impedances as a function of frequency, having the minimum impedance at the resonance frequency fr and the maximum impedance at the antiresonance frequency fa. At the frequencies other than the above described frequencies, the impedance is dependent on the capacitance or the inductance of the piezoelectric resonator and exhibits a capacitive or inductive nature. The resonance frequency fr of the piezoelectric resonator 12 is selected to be approximately consistent with the frequency where the attenuation pole of the frequency characteristic of the surface acoustic wave device 1 appears.

The inventive filter circuit is thus structured. The filter circuit comprises a tuning circuit including a capacitance component (a clamp capacitance) of the input transducer 2 and the tuning coil 11. By selecting the resonance frequency fr of the piezoelectric resonator 12 to be approximately consistent with the frequency of the attenuation pole at the higher region, the piezoelectric resonator 12 comes to exhibit a capacitive nature at the passband of the surface acoustic wave device 11 (see the curve B in FIG. 3). Accordingly, the piezoelectric resonator 12 serves as one component of the tuning capacitance in the passband, with the result that a tuning circuit is constituted by the input transducer 2, the tuning coil 11 and the piezoelectric resonator 12. By properly selecting the inductance of the tuning coil 11, the insertion loss in the passband of the surface acoustic wave device 1 can be limited to a small value. More specifically, the inductance of the tuning coil 11 is selected such that the tuning circuit implemented by the clamp capacitance of the input transducer 2 and the capacitance of the piezoelectric resonator 12 may be tuned to a given frequency in the passband. On the other hand, since the piezoelectric resonator 12 has a low impedance at the resonance frequency fr of the piezoelectric resonator 12, i.e. at the frequency of the attenuation pole at the high region, the tuning coil 11 then apears to be short-circuited. Accordingly, the turning condition of the tuning circuit including the tuning coil 11 is largely disturbed and accordingly the degree of attenuation at the frequency of the attenuation pole at both sides of the passband becomes extremely large.

In the FIG. 2 embodiment, the parallel circuit of the tuning coil 11 and the piezoelectric resonator 12 may be connected in series with the output transducer 3, as shown by the dotted line in FIG. 2. Alternatively, such parallel circuit may be connected in series with both the input transducer 2 and the output transducer 3.

A description was provided above of a case where the resonance frequency of the piezoelectric resonator 12 is selected to be approximately consistent with the frequency of the attenuation pole in the higher region of the passband. However, alternatively the resonance frequency fr may be selected to be approximately consistent with the frequency of the attenuation pole in the lower region of the passband. In the case where the resonance frequency fr is selected to be consistent with the frequency of the attenuation pole at the lower region, the antiresonance frequency fa of the piezoelectric resonator 12 is included in the passband, as is seen from FIG. 3. Accordingly, the piezoelectric resonator 12 does not become purely capacitive in the passband. However, since the piezoelectric resonator 12 has a high impedance at the antiresonance frequency fa, such can be considered as if the piezoelectric resonator 12 had not been inserted, and accordingly very little influence is exerted upon the passband of the frequency characteristic. As is seen from the curve B in FIG. 3, the piezoelectric resonator 12 becomes inductive or capacitive at the frequencies between the resonance frequency fr and the antiresonance frequency fa or at the frequencies higher than the antiresonance frequency fa. If and when the piezoelectric resonator 12 exhibits a capacitive nature, the capacitive component thereof as well as the clamp capacitance of the transducer serves as a tuning capacitance, as in the case of the foregoing description, whereas if and when the piezoelectric resonator 12 exhibits an inductive nature, the inductance component thereof as well as the tuning coil 11 serves as a tuning inductance. Accordingly, when the resonance frequency fr of the piezoelectric resonator 12 is to be selected to be approximately consistent with the frequency of the attenuation pole in the lower region of the passband, the tuning condition is always met with respect to the frequencies in the passband. Accordingly, it will be appreciated that the tuning frequency fr of the piezoelectric resonator 12 may be selected to be consistent with the frequency at the attenuation pole at either the lower or the higher region of the passband.

Figure 4:
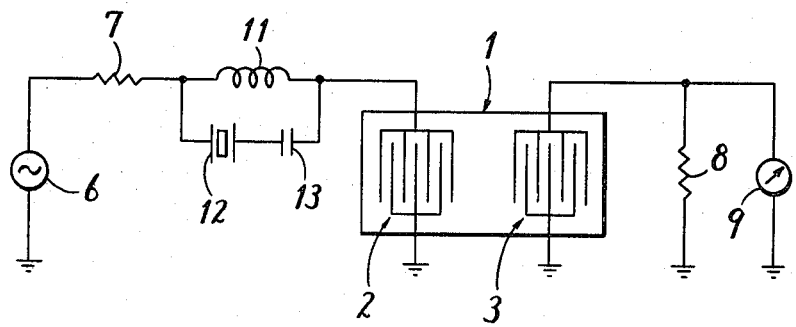
FIGS. 4 and 5 are schematic diagrams showing major portions of other embodiments of the present invention.
Figure 5:
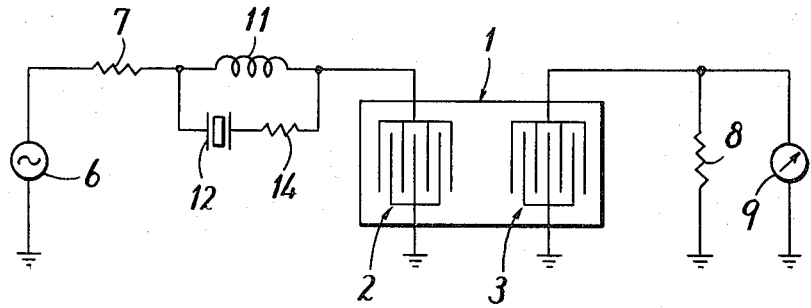

In the case where the frequency range between the resonance frequency fr and the antiresonance frequency fa of the piezoelectric resonator 12 is wide and/or the variation range of the impedance of the piezoelectric resonator 12 is too large, it could happen that the piezoelectric resonator 12 exerts an influence upon the passband. In such a case, a device, such as a capacitor 13 (FIG. 4) or a resistor 14 (FIG. 5), for decreasing an impedance changing range of the added piezoelectric resonator 12 is preferably connected in series with the piezoelectric resonator 12, as shown in FIGS. 4 and 5. By connecting the capacitor 13 in series with the piezoelectric resonator 12, the frequency range between the resonance frequency fr and the antiresonance frequency fa in the characteristic as shown in FIG. 3 is decreased. More specifically, insertion of the capacitor 13 makes the resonace frequency fr higher and the antiresonance frequency fa lower. On the other hand, by connecting the resistor 14 in series with the piezoelectric resonator 12, the impedance value in the characteristic of the piezoelectric resonator as shown in FIG. 3 is changed by the resistor 14. More specifically, insertion of the resistor 14 makes the minimum impedance at the resonance frequency fr larger and the maximum impedance at the antiresonance frequency fa smaller. Accordingly, the degree of the impedance change becomes smaller at the frequencies lower than the resonance frequency fr of the piezoelectric resonator 12. Therefore, by selecting the resonance frequency fr to be consistent with the frequency (60.4 MHz) at the attenuation pole of the higher region, for example, undesired attenuation at the frequencies in the passband lower than the resonance frequency fr can be suppressed.

Even in the embodiments depicted in conjunction with FIGS. 4 and 5, a parallel circuit including a piezoelectric resonator 12 may be connected in series with the output transducer 3, as previously described in conjunction with FIG. 2. Alternatively, such parallel circuit may be connected in series with both of the input transducer 2 and the output transducer 3.

Figure 6:
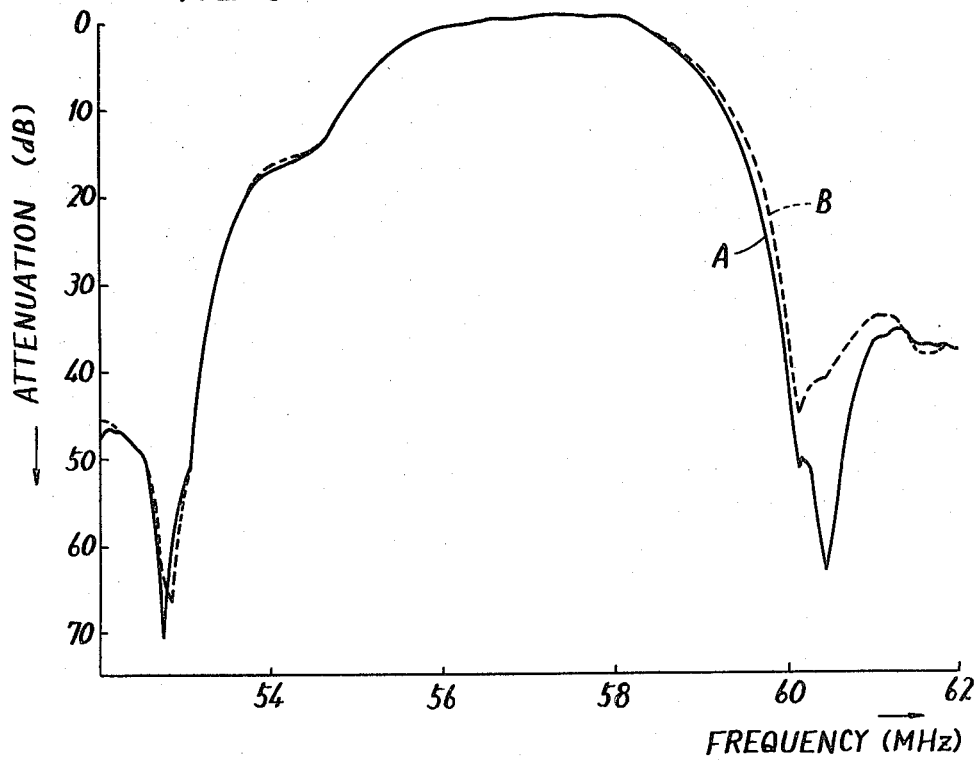
FIG. 6 is a graph showing the frequency characteristic of a preferred embodiment of the present invention.

Now referring to the FIG. 6 graph, a description will be given of how the degree of attenuation is improved by taking a specific example of the present invention (corresponding to the FIG. 4 embodiment). The specific example comprises the FIG. 4 surface acoustic wave device 1, which is structured as the video intermediate frequency filter of a television receiver in accordance with the Japanese standard, having a center frequency of 58 MHz in the passband. On the other hand, the piezoelectric resonator 12 comprises a ceramic resonator having a third resonance point at 60.4 MHz. The capacitance of the capacitor 13 was selected to be 8 pF. In consideration of the clamp capacitance of the input transducer 2, the capacitance of the piezoelectric resonator 12 and the capacitance of the capacitor 13, the inductance of the tuning coil 11 was selected such that the tuning frequency may be a given frequency in the passband. More specifically, the inductance of the tuning coil 11 is selected to be a value so that the insertion loss in the passband may be minimal. In the case of the above described specific example, the frequency characteristic as shown by the solid curve A in FIG. 6 was obtained. On the other hand, the dotted line curve B in FIG. 6 shows a frequency characteristic of the FIG. 4 embodiment in which the piezoelectric resonator 12 and the capacitor 13 are not connected and the inductance of the tuning coil 11 is selected in which the insertion loss in the passband becomes minimal. As is apparent from the comparison of the two frequency characteristics shown by the curves A and B, the attenuation amount in the vicinity of the frequency (60.4 MHz) at the attenuation pole in the higher region has been improved by more than 10 dB in accordance with the present invention. Furthermore, even in the vicinity of the frequency of the attenuation pole in the lower region, the attenuation amount has been improved. In addition, noting the passband, it will be appreciated that the frequency characteristic has been very little influenced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A filter circuit located between an input and an output terminal, comprising:
   a surface acoustic wave device having an input transducer and an output transducer acoustically coupled to each other and electrically connected to said input and output terminals, respectively;
   a tuning coil connected in series between one said transducer and said terminal which is electrically connected thereto; and
   a piezoelectric resonator connected in parallel with said tuning coil.

2. A filter circuit in accordance with claim 1, which is a bandpass filter having a characteristic that has an attenuation pole at a predetermined frequency, and wherein said resonance frequency of said piezoelectric resonator is selected to be approximately equal to said predetermined frequency.

3. A filter circuit in accordance with claim 2, wherein said characteristic has a second attenuation pole at a second predetermined frequency, one said predetermined frequency being lower than the other, said passband lying between said two predetermined frequencies, and said resonance frequency of said piezoelectric resonator being selected to be approximately equal to the higher said predetermined frequency.

4. A filter circuit in accordance with claim 2, wherein said characteristic has a second attenuation pole at a second predetermined frequency, one said predetermined frequency being lower then the other, said passband lying between said two predetermined frequencies, and said resonance frequency of said piezoelectric resonator being selected to be approximately equal to the lower said predetermined frequency.

5. A filter circuit in accordance with claim 3 or, 4, wherein the inductance of said tuning coil forms a tuning circuit together the clamp capacitance of said one transducer and the capacitance component of said piezoelectric resonator, and said tuning circuit is tuned to a predetermined frequency in said passband.

6. A filter circuit in accordance with claim 1, 2, 3, or 4, wherein said piezoelectric resonator displays a range of impedances as a function of frequency, and said filter circuit further comprising a device connected in series with said piezoelectric resonator for decreasing said range of impedances of said piezoelectric resonator, and wherein said device and said piezoelectric resonator are both connected in parallel with said tuning coil.

7. A filter circuit in accordance with claim 6, wherein said device for decreasing said range of impedance comprises a resistive component.

8. A filter circuit in accordance with claim 6, wherein said device for decreasing said range of impedance comprises a capacitive component.

* * * * *